United States Patent
Ullman et al.

(10) Patent No.: US 6,771,686 B1
(45) Date of Patent: Aug. 3, 2004

(54) OPTICAL ARRANGEMENT FOR THE USE DURING A LASER DIODE ARRANGEMENT AS WELL AS LASER DIODE ARRANGEMENT WITH SUCH AN OPTICAL ARRANGEMENT

(75) Inventors: Christoph Ullman, Bad Honnef (DE); Volker Krause, Hohr-Grenzhausen (DE)

(73) Assignee: Laserline Gesellschaft fur Entwicklung und Vertrieb, Koblenz (DE)

( * ) Notice: Subject to any disclaimer, the term of this patent is extended or adjusted under 35 U.S.C. 154(b) by 138 days.

(21) Appl. No.: 09/641,570

(22) Filed: Aug. 18, 2000

(30) Foreign Application Priority Data

Aug. 21, 1999 (DE) .......................................... 199 39 750

(51) Int. Cl.[7] .............................................. H01S 3/09
(52) U.S. Cl. .............................. 372/92; 372/69; 372/34; 372/36
(58) Field of Search ..................... 372/92, 69; 359/641, 359/222, 618, 639, 710; 219/121.73; 385/8

(56) References Cited

U.S. PATENT DOCUMENTS

| | | | | |
|---|---|---|---|---|
| 5,784,203 A | * | 7/1998 | Beckmann | ................... 359/618 |
| 5,986,794 A | * | 11/1999 | Krause et al. | .............. 359/222 |
| 6,088,170 A | * | 7/2000 | Lee et al. | .................... 359/710 |
| 6,137,631 A | * | 10/2000 | Moulin | ........................ 359/618 |
| 6,154,278 A | * | 11/2000 | Ito et al. | ...................... 356/354 |
| 6,301,054 B1 | * | 10/2001 | Van Tran | ..................... 359/639 |
| 6,337,873 B1 | * | 1/2002 | Goering et al. | ................ 372/69 |
| 6,400,512 B1 | * | 6/2002 | Hildebrandt | ................. 359/639 |
| 2002/0025096 A1 | * | 2/2002 | Wang et al. | .................... 385/8 |

* cited by examiner

*Primary Examiner*—Dong Wong
*Assistant Examiner*—Dung Nguyen
(74) *Attorney, Agent, or Firm*—Hoffman Wasson & Gitler, P.C.

(57) ABSTRACT

By dividing at least the part of the correction optics of at least one row of emitter elements, i.e. the part acting as the fast axis collimator, into several segments, the degradation of beam quality at the focus, especially the widening of the focus, which is caused by the nonconformities between the diode laser bars, or between the row of emitter elements, and the correction optics, can be effectively prevented.

44 Claims, 9 Drawing Sheets

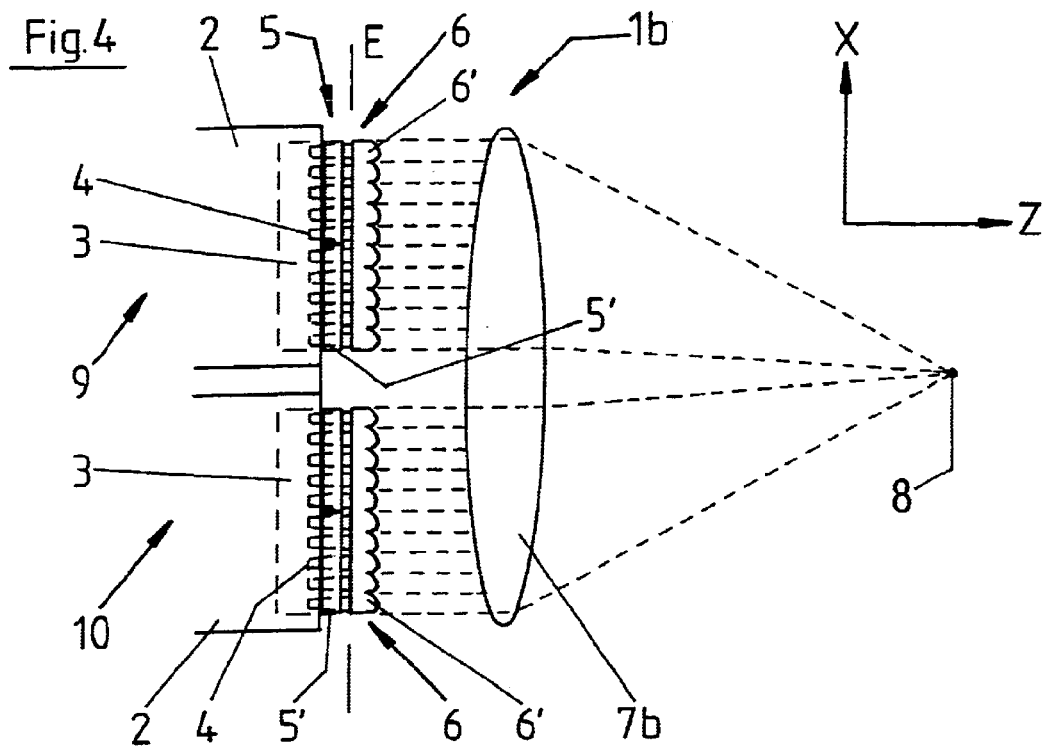
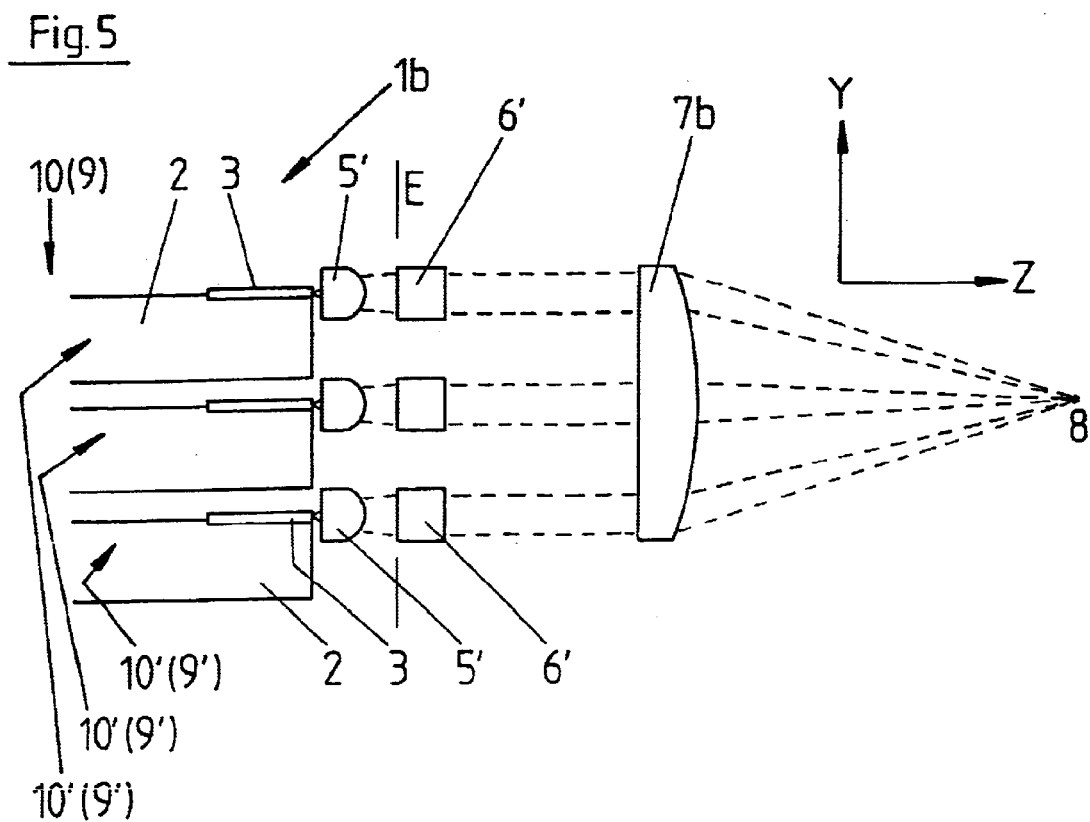

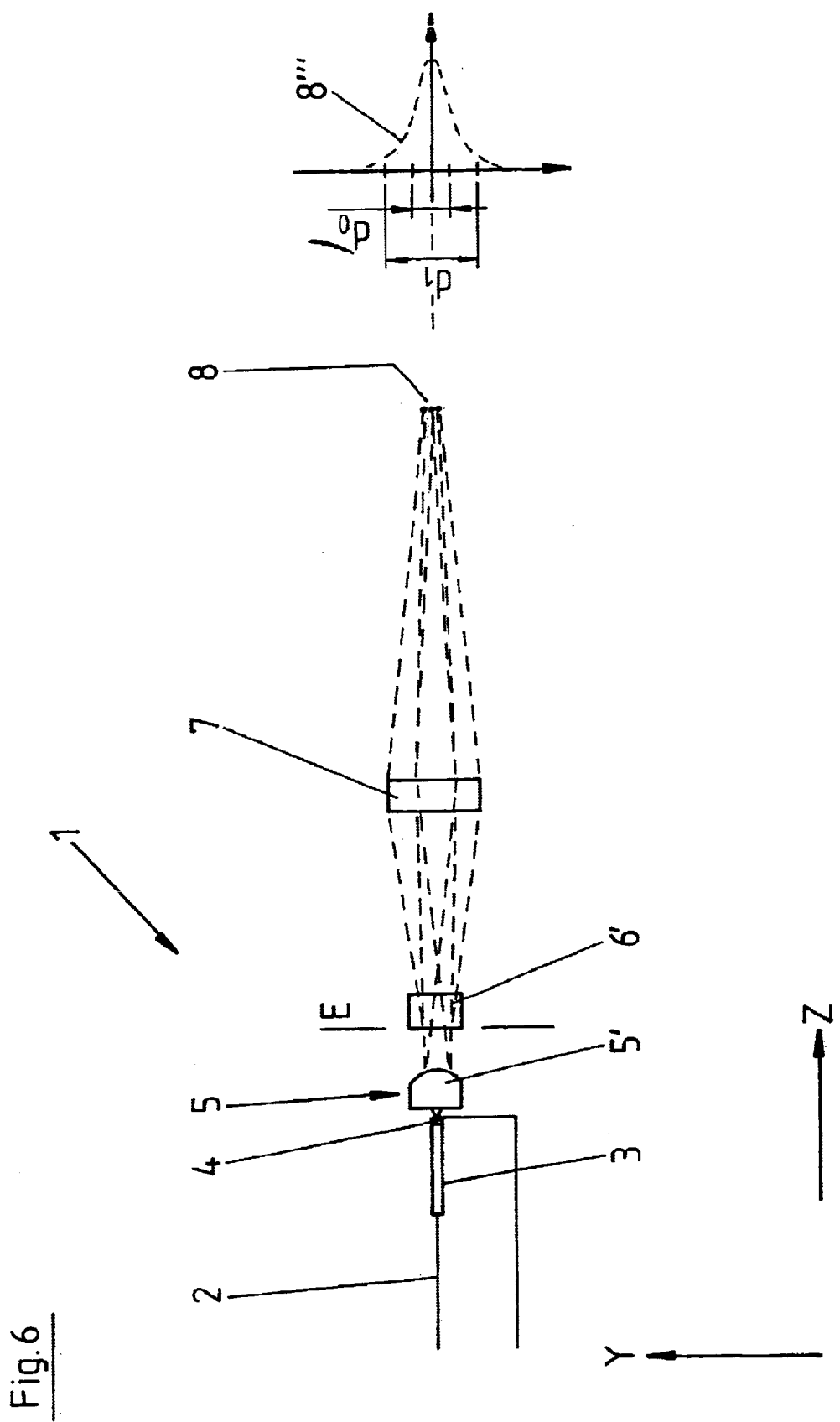

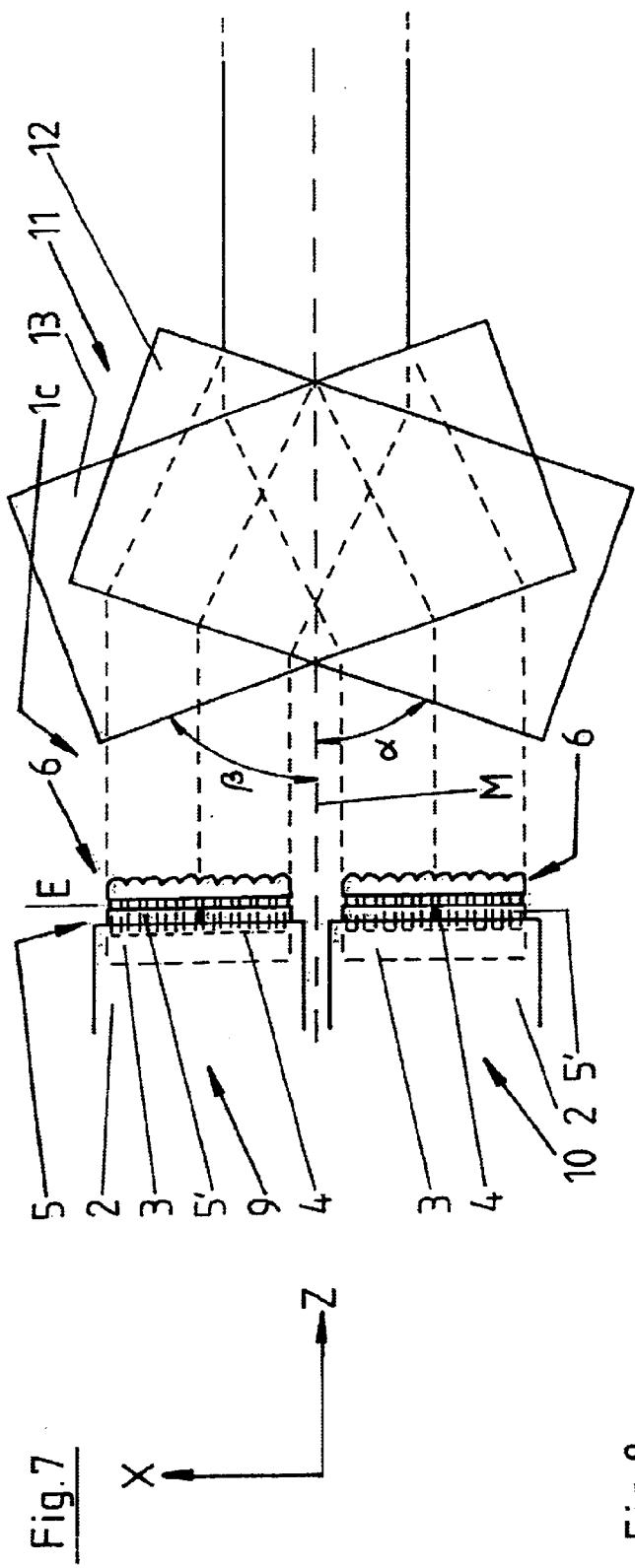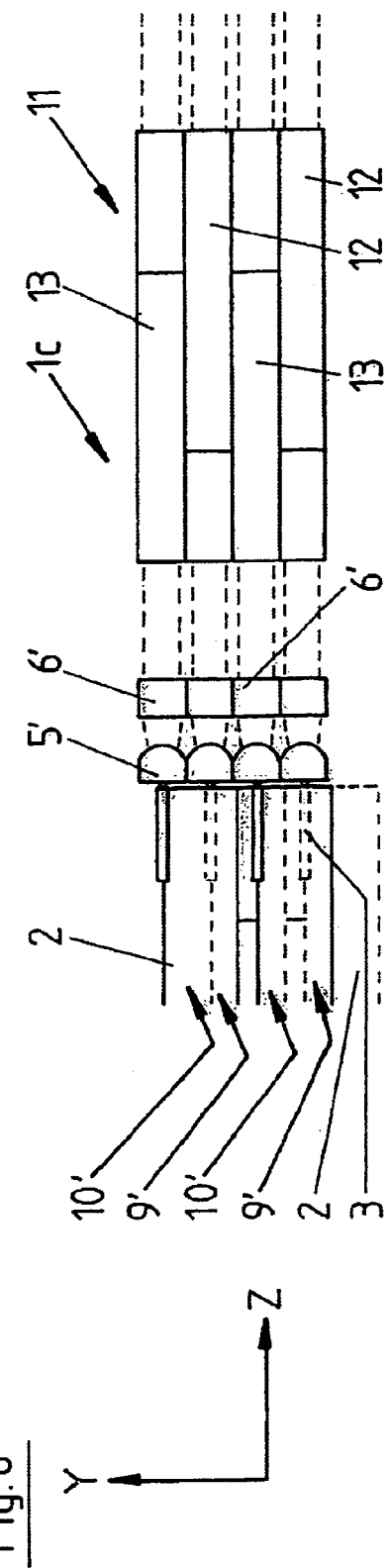
Fig.7
Fig.8

US 6,771,686 B1

OPTICAL ARRANGEMENT FOR THE USE DURING A LASER DIODE ARRANGEMENT AS WELL AS LASER DIODE ARRANGEMENT WITH SUCH AN OPTICAL ARRANGEMENT

BACKGROUND OF THE INVENTION

The invention relates to an optical arrangement, and more particularly, to a laser diode arrangement with at least one row of emitter elements which emit laser light and which are arranged in the row with their active layer in a common plane and perpendicular to their first axis.

The radiation of a semiconductor diode laser (here, in simplified terms, also a diode laser) is characterized by a highly diverging beam, in contrast to conventional laser beam sources, with a laser beam which has a diameter of a few millimeters with low beam divergence in the range of a few mrad, while the divergence for a diode laser exceeds 1000 mrad.

Furthermore, it is also known that in diode lasers, the angle of divergence in the plane perpendicular to the active layer, i.e. in the so-called "fast axis", is greater than in the plane of the active layer, i.e. in the so-called "slow axis".

To attain a laser power as high as possible, for example 20–40 watts from a semiconductor chip, numerous emitters are combined on a so-called bar. Ordinarily 10–50 individual emitters, or emitter groups, are arranged following one another in a row in the plane parallel to the active layer, i.e. in the slow axis. The resulting overall beam of this bar in the plane parallel to the active layer has an opening angle of roughly 10° and a beam diameter of roughly 10 mm. This yields a beam quality in this plane which is many times less than the beam quality in the plane perpendicular to the active layer.

The occupation density which results from the quotient of the radiating area of the laser bar to the total area in currently available diode laser bars is roughly 30–50%, in any case higher occupation densities allowing only pulsed operation of the laser. For continuous applications, smaller occupation densities are necessary.

In order the make the highly divergent radiation of a diode laser useful for laser applications, for example, material machining, medical technology, pumping of solid state lasers, etc., collimating and focusing optical arrangements are necessary in the beam path. These optical arrangements contain one fast axis collimator, which is made as micro optics, and which has the optical property of a cylinder lens which lies with its axis parallel to the slow axis, for all emitters of a diode laser bar its own continuous cylinder lens being used with a small focal distance in the immediate vicinity of the facet of the diode laser bar, i.e. at a distance of a few hundred mu from the emitters or from this facet. The divergence in the slow axis is then corrected by following macro-optics.

To attain higher powers, as are necessary, for example, in materials machining, in medical engineering, for pumping of solid state lasers, etc., providing several rows of emitters or several diode laser bars in a stack in several planes on top of one another is known, these planes being offset against one another in the direction of the fast axis and to each row of emitters, or each diode laser bar of each plane, its own fast axis collimator being assigned.

In particular, a laser diode arrangement (U.S. Pat. No. 5,802,092) is known in which the slow axis collimator is formed by a host of cylinder lens elements which follow one another in the direction of the slow axis and which with their axes are each located in the fast axis and of which one element at a time is assigned to one emitter of a row of emitters. Furthermore, the arrangement is made such that the beams of the individual emitters which are collimated in the plane of the slow axis with the cylinder lens elements, which are parallel, or essentially parallel, directly adjoin one another so that a beam cluster with a high filling factor is achieved which then can be focussed using a focussing lens at the focal point.

However, optimum focusing of the radiation of all emitters at a common focus requires optimum fast axis collimation and with it alignment of the individual beams of the emitters of the respective row, or respective bar, as parallel as possible, such that the emitters could be imaged on a line as straight as possible after this fast axis collimation. But generally, this cannot be accomplished in ideal form, due to nonconformities, i.e. deviations of the conformity between the diode laser bars and the fast axis collimator. These deviations can be of different origin, for example due to production tolerances and/or deformation during installation, etc. These nonconformities which are not avoided in the prior art, lead to widening of the focus in the fast axis and thus to degradation of the beam quality at the focus.

The object of the invention is to devise an optical arrangement and a laser diode arrangement with one such optical arrangement which avoids these defects.

SUMMARY OF THE INVENTION

By dividing at least the part of the correction optics of at least one row of emitter elements, i.e. the part acting as the fast axis collimator, into several segments, the degradation of beam quality at the focus, especially the widening of the focus, which is caused by the nonconformities between the diode laser bars, or between the row of emitter elements, and the correction optics, can be effectively prevented.

According to another aspect, the invention relates to i a special execution of the correction optics such that it is formed by at least one lens element, but preferably by several lens elements which adjoin one another in the direction of the slow axis, which acts, or act, both as the fast axis collimator and as the slow axis collimator, both effects being accomplished in a single lens body of the respective lens element. However, each lens element can also be built of several lenses following one another in the beam path. If the lens elements each consist of only a single lens body, there is also the possibility of producing all the correction optics, or just segments of these optics, in one piece or monolithically.

BRIEF DESCRIPTION OF THE DRAWINGS

The invention is detailed below as depicted in the following figures:

FIG. 4 shows an overhead view of another embodiment of a laser diode arrangement as claimed in the invention with two stacks of diode laser bars which are offset against one another in the direction of the first coordinate axis (X axis), which bars in turn are located in the plane of the drawing of FIG. 4, and with an optical arrangement for collimation and focusing of the beams of all emitters at a common focus;

FIG. 5 shows in a simplified representation a side view of the laser diode arrangement of FIG. 4;

FIG. 6 shows a representation similar to FIG. 2 to explain the effect of nonconformities between a diode laser bar and a fast axis collimator on the quality of the focus in the laser diode arrangement of FIGS. 1 and 2;

FIGS. 7 and 8 show in an overhead view and in a side view of an alternate embodiment of the laser diode arrangement as claimed in the invention;

DETAILED DESCRIPTION OF THE INVENTION

For better understanding and simpler orientation, in the figures there are three coordinate axes which run perpendicular to one another labeled X, Y and Z and below they are called the X axis, Y axis and Z axis, and of which the X axis and Z axis jointly define the plane of the drawings (X-Z plane) of FIGS. 1, 3, 4, 7 and 9–11 and the Y axis and the Z axis together define the planes of the drawings (Y-Z) plane of FIGS. 2, 5, 6 and 8.

Figure 1:
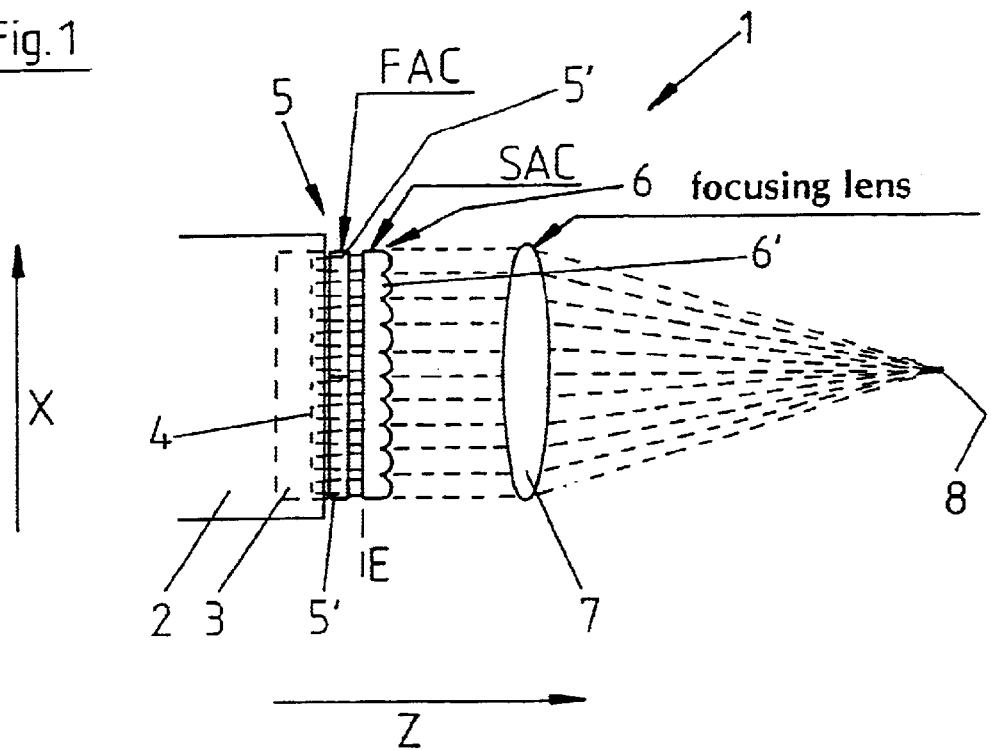
FIG. 1 shows, in a simplified representation, an overhead view of a laser diode arrangement with several emitters which follow one another on a diode laser bar (chip) in the plane of the drawing in FIG. 1 (X-Z plane) in one coordinate direction (X axis), and with an optical arrangement for collimation and focusing of the beams of the individual emitters at a common focus.
Figure 2:
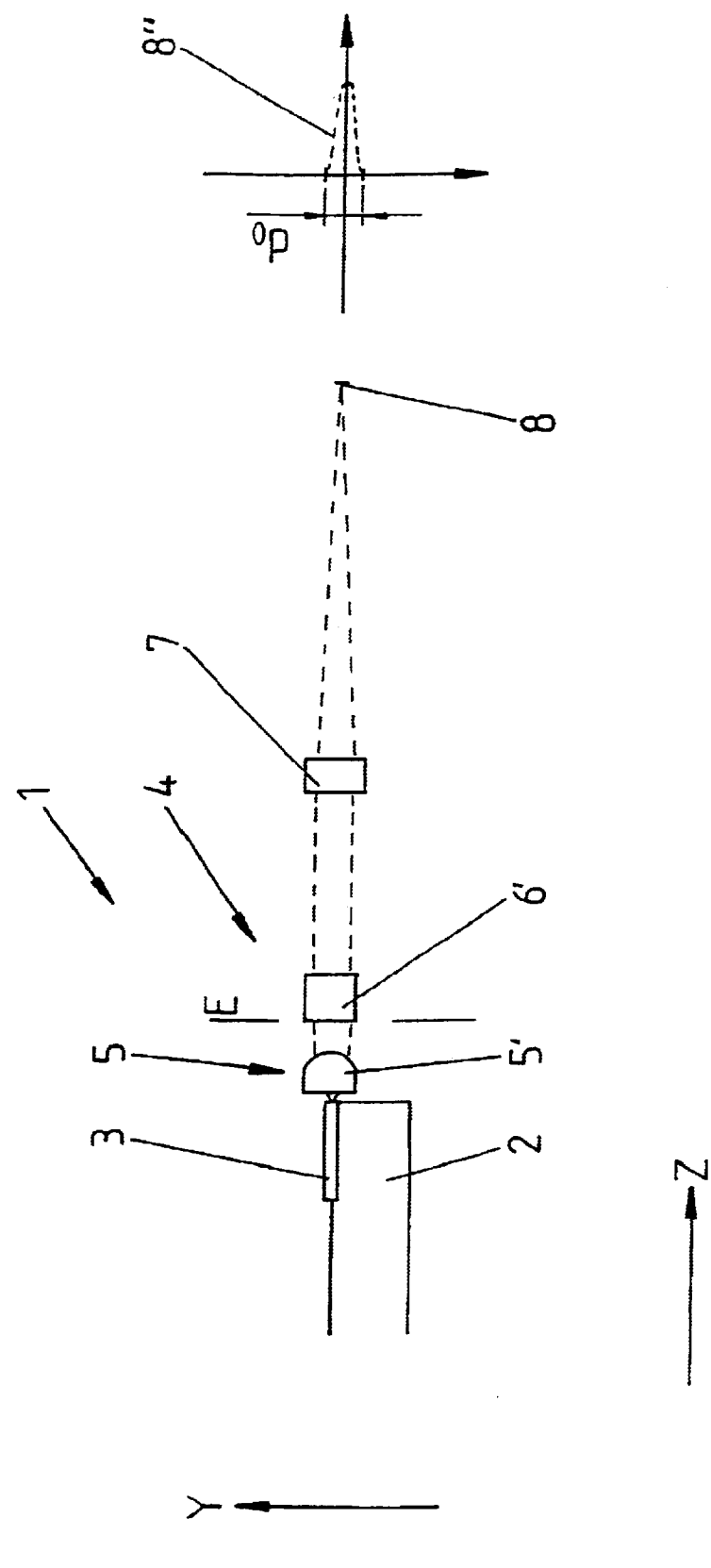
FIG. 2 shows a side view of the laser diode arrangement of FIG. 1.

FIGS. 1 and 2 show a laser diode arrangement which includes a diode laser bar 3, which is located on a cooler 2 (heat sink) and which is produced as a semiconductor chip with a plurality of emitters 5, which emit laser light and which lie with their active layer ideally in a common plane, specifically in the representation chosen for FIGS. 1 and 2 in the X-Z plane, and following one another in the axial direction which runs in this plane, i.e. in the representation chosen for the figures following one another in the Y axis and spaced apart on the semiconductor chip, or bar 3. In the embodiment shown, the laser bar 3 with respect to the extension of the individual emitters 4 in the direction of the X axis and the distance between these emitters in this axis is made such that the occupancy density is less than 10%, i.e. less than 10% of the entire length, which the bar 3 has in the direction of the X axis is occupied by the emitters 4, while the remainder of the length of the laser bar 3 is not radiating.

The individual emitters 4 deliver a laser beam which has divergence both in the fast axis, i.e. in the Y axis, and also in the slow axis, i.e. in the X axis. To eliminate this beam divergence there are optical correction elements, in the beam path following the emitters 4, first a fast axis collimator 5 located directly on the laser bar 3, following this collimator 5 in the beam direction, i.e. in the direction of the Z axis, a slow axis collimator 6, and following this, a focusing means 7, which in the embodiment shown is formed by a focusing lens and with which the beams of all emitters 4 are focused at a common focal point 8.

As FIG. 2 shows, the fast axis collimator 5 produces beams which are parallel in the plane of this fast axis from the beams diverging in the fast axis (Y axis) and which still have divergence in the slow axis, i.e. in the X axis. The fast axis collimator 5, in this embodiment, has two segments 5', which adjoin one another in the direction of the X axis, with a transition between two emitters on the non-active part of the laser bar 3, and which each correspond in their action to a cylinder lens which extends with its axis in the direction of the X axis. The two elements 5' can be adjusted individually or independently of one another, and especially by vertical adjustment in the Y axis and by tilting around the Z axis. In the other axes, the optical elements 5' are individually adjustable. In the embodiment shown, the elements 5' are microcylinder lenses.

The slow axis collimator 6 includes several optical elements 6', which in their action, correspond to one cylinder lens at a time and which with their axis are located in the fast axis, i.e. in the chosen representation in the Y axis. The execution is such that for each emitter 4, there is one such element 6'. Moreover, the slow axis collimator 6 is located in a plane E perpendicular to the beam path, i.e. perpendicular to the Z axis, on which the edge beams of the beams of adjacent emitters 4 diverging in the slow axis intersect. Moreover, the grid size in which the elements 6' on the slow axis collimator 6 are provided in the slow axis (X axis) following one another is equal to the grid size of the emitters 4 on the laser bar 3. The elements 6' directly adjoin one another in the direction of the slow axis.

As FIG. 1 shows, the elements 6' convert the beams of the emitters 4 diverging in the slow axis into beams which run parallel in the plane of the slow axis (X-Z plane) so that then the beams which are collimated both in the fast axis, and the slow axis, can be focused by the focusing optics 7 at the common focus 8.

The individual elements 6' are combined into a monolithic collimator 6. The relatively low occupation density of the laser bar 3 makes it possible in the above described manner to provide one element 6' for each emitter 4. Basically it is also possible to provide one common optical element 6' for each of these emitter groups when there are several of them formed on the laser bar 3 which each have at least two emitters 4 located tightly next to another and which then are offset in the direction of the fast axis at a greater distance from one another.

In FIG. 1 the power distribution at the focus 8 in the direction of the slow axis (X axis) is labelled 8'. Accordingly, in FIG. 2 the power distribution at the focus 8 in the fast axis (Y axis) is labelled 8''. As stated above, faults can occur due to deviations or tolerances between the fast axis collimator 5 and the laser bar 3 and they then lead to widening of the focus, 8 in the fast axis, as is shown in FIG. 6 by the broken lines of the beam characteristic and by the distribution 8'''. To reduce these faults and achieve the desired diameter of the focus which is the same in both axes, there is individual adjustment of the elements 5' with which then these tolerances in the shaping of the elements 5' and the laser bar 3 can be balanced.

Segmenting the fast axis collimator 5 makes it possible to achieve optical collimation and focusing for both sections of the laser bar 3 which are each assigned to the elements 5'. With respect to the quality of the focus 8, only the difference in shape between the respective element 5' and the assigned shortened part of the laser bar 3 is relevant, this deviation of shape, or tolerance, having only a greatly reduced effect on the quality of the focus 8 due to the shorter relevant length of the laser bar.

In the laser diode arrangement 1 the segmenting is such that all the emitters 4, emit onto the usable surfaces of the fast axis collimator 5, i.e. the connection areas or gaps between the adjoining elements 5' each lying between two emitters 4 which follow one another on the laser bar 3.

Figure 3:
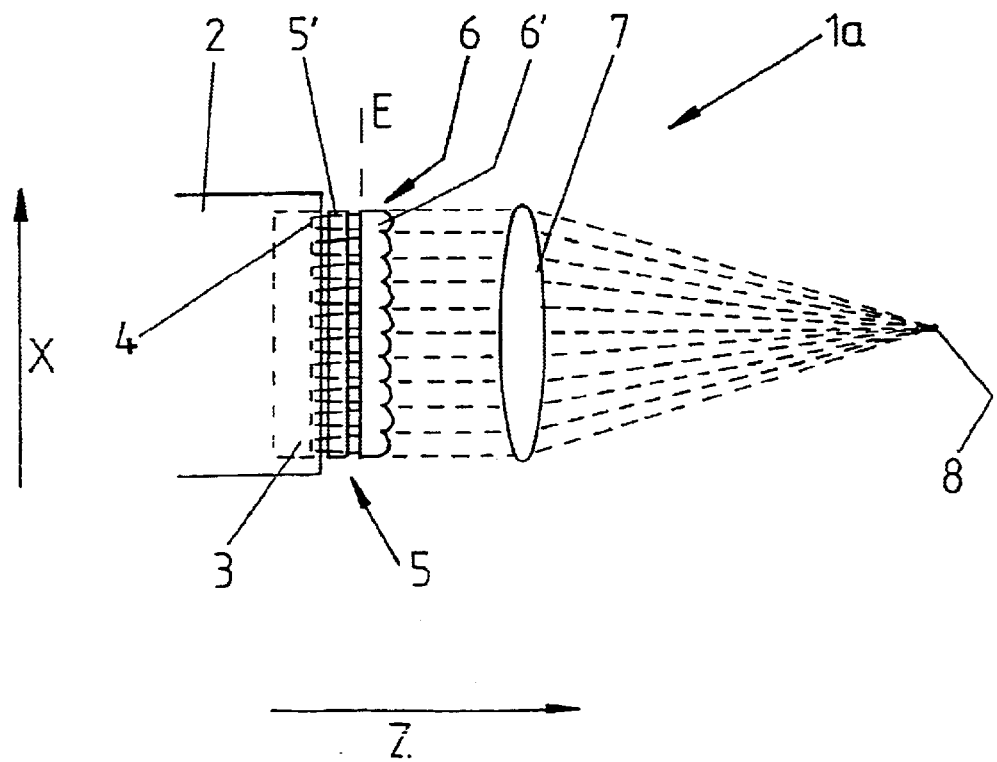
FIG. 3 shows an alternate embodiment of the arrangement of FIG. 1.

FIG. 3 shows, as a second possibility, a laser diode arrangement 1a which differs from the first arrangement 1 in that the fast axis collimator 5 is segmented three times, i.e. includes three elements 5', which can each be individually adjusted so that the effective length of the laser bar 3, i.e. the length assigned to each element 5', is still shorter and thus the influences of tolerances which cannot be balanced by the individual adjustment of the elements 5' on the quality of the focus are still less. Segmenting is also done in the laser diode arrangement 1a such that all emitters 4 radiate onto the usable surfaces of the fast axis collimator, i.e. the connecting areas or gaps between the adjoining elements 5' in turn each lie between two emitters 4 which follow one another in the laser bar 3.

Different segmenting of the fast axis collimator is also possible. For example, 2× to 5× segmenting is feasible in a laser bar 3 with, for example, 100 emitters 4.

FIGS. 4 and 5 show an alternate embodiment of a laser diode arrangement 1b in which the laser bars 3 with their pertinent cooling bodies 2 are located in two stacks 9 and 10. The stacks 9 and 10 are offset against one another in the direction of the X axis. In each stack the laser bars are arranged with the active plane of the emitters 4 in the X-Z plane such that in these figures, the fast axis, of all emitters 4, is in turn the Y axis and the emitters 4, on each bar 3, follow one another in the direction to the X axis. In each stack 9, the laser diode bars 3 are offset against one another, or spaced apart, in the direction of the Y axis by the distance y (FIG. 5). As FIGS. 4 and 5 show, the stacks 9, and 10, form several stack layers 9' and 10', i.e. in the embodiment shown three layers of stacks at a time, each layer of stacks having a laser bar 3, a fast axis collimator 5, and a slow axis collimator 6, which are arranged and formed in the same way as was described above for the laser diode arrangement 1. In the laser diode arrangement 1b, the fast axis collimators 5 are each segmented twice, i.e. they each have two individually adjustable elements 5'.

The parallel beams of the individual emitters collimated in the plane of the fast axis and the slow axis are then focused, via focusing optics 7b, which are-shared by both stacks 9 and 10 at the common focus 8. In this embodiment, with high power can be achieved, and the beam quality, or the quality of the focus 8, can be greatly improved by individual adjustment capacity of the individual elements 5'.

The number of elements 5' of the fast axis collimators 5 can be chosen differently. It is possible to choose the number of elements 5' to be different in the different stack layers 9' and 10', for example, in some stack layers to segment the fast collimators 5 into two and in some stack layers into three, etc.

It is also possible to provide laser bars 3 in only one stack, or in more than two stacks, it is also feasible to adapt the stack height and stack width such that the same extension for the radiation field formed by the emitters 4 results in the slow axis and the fast axis. For example, at a stack height of 30 mm and a stack width of 10 mm, the laser diode arrangement would have a total of three stacks which are located next to one another in the direction of the X axis.

In the laser diode arrangement 1b as described above, for the individual stack layers 9' and 10', there are separate slow axis collimators 6. This makes it possible to adjust these collimators 6 in each stack layer individually with reference to the pertinent laser bars 3 or the emitters 4 there, with which in turn, a major improvement of the beam quality or the focus 8 is possible.

In the laser diode arrangement 1b there is one stack layer 9' of the stack 9, located in a common X-Z plane, with a stack length 10' of the stack 10.

FIGS. 7 and 8 show another embodiment of a laser diode arrangement 1c in which the planes of the stack layers 9' and 10' and thus the planes of the laser bars 3 (X-Z planes) in the stack 9 are offset by half the distance y relative to the corresponding planes in the stack 10. By means of an optical element 11, which is located between the slow axis collimators 6, and the focusing optics 7c the beams of the emitters 4 of the stack layers 9', and 10', in the direction of the Z axis are pushed over one another interdigitally, such that in the beam path following the optical element 11, in the direction of the fast axis (Y axis), one plane of the beams of the stack layer 10' follows one plane of the beams of the stack layer 9', etc. The beam group produced in this way is then focused via the common focusing optics 7' at the common focus.

For the sake of simpler representation, FIGS. 7 and 8 show the two stacks 9 and 10 such that each stack has only two stack layers 9' and 10', overall therefore there are four stack layers and thus also four planes in which the laser diode bars 3 are located (the number of stacks multiplied by the number of diode laser bars 3 in each stack).

The optical arrangement 11 includes several plate-shaped prisms 12 and 13 which are made rectangular in an overhead view, with the same size, and which are oriented with their larger surface sides oriented perpendicular to the fast axis (Y axis) and in this direction adjoin one another stacked on top of one another such that one prism 13 is adjacent to one prism 12 at a time.

The prisms 12 are assigned to the stack 9, and to one diode laser bar 3, of this stack, or a stack layer 9', at a time and the prisms 12 are assigned to the stack 10, or one diode laser bar 3, at a time, or a stack layer 10' of this stack. Furthermore, the prisms 12 and 13 with their longer peripheral sides which lie in planes perpendicular to the X-Z plane and which also form the light entry and exit sides of the respective prism, include an angle a (prism 12) and an angle b (prism 13) with the center plane M which runs in the middle between the two stacks 9 and 10 and parallel to the Y-Z plane. Both angles, a and b, are the same size and are less than 90°, in any case with reversed signs with reference to the center plane M. Furthermore, the angles, a and b, are chosen with consideration of the refractive index when the laser beams enter, or exit, the prisms 12 and 13, the laser beams are pushed on top of one another in the X axis in the aforementioned manner. Using focusing optics, which are not shown then the laser beams of all emitters 4 can again be focused at a common focus.

In addition to the optical element 11, and the prisms 12 and 13, other optical elements or means can be used.

While in the laser diode arrangements 1, 1a and 1b, an increase of the filling factor in the overall beam supplied, for example to the focusing optics 7a and 7b, is achieved in the slow axis (X axis), in the laser diode arrangement 1c, by interdigitally pushing the laser beams of the two stacks, 9 and 10, on top of one another by means of the optical element 11, the filling factor in the fast axis (Y axis) is increased. If the two stacks, 9 and 10, for example, have a filling factor of 50% in the fast axis (Y axis), it is possible, with the laser diode arrangement 1c, to transfer the radiation of the adjacent stacks 9 and 10 into a common radiation field with an optical filling factor of almost 100%. The lengthwise sides of the plate-shaped prisms, 12 and 13, form on each prism parallel entry and exit surfaces by which parallel offset or parallel displacement of the laser beams is achieved.

By increasing the filling factor of the beam cluster, at the same power, the diameter of the beam cluster is reduced, and thus, the beam quality, which is defined as the product of the beam diameter and the beam divergence, is improved. Furthermore, reducing the diameter of the beam cluster also simplifies the focusing means.

Figure 9:
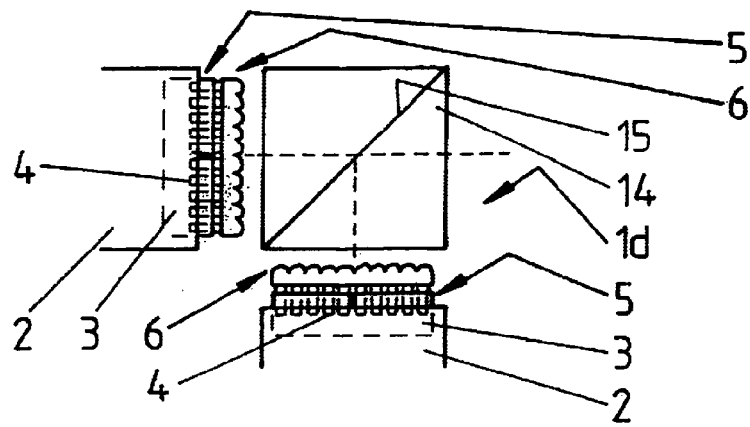
FIGS. 9–12 each show an overhead view of alternate embodiments of the laser diode arrangement as claimed in the invention.
Figure 10:
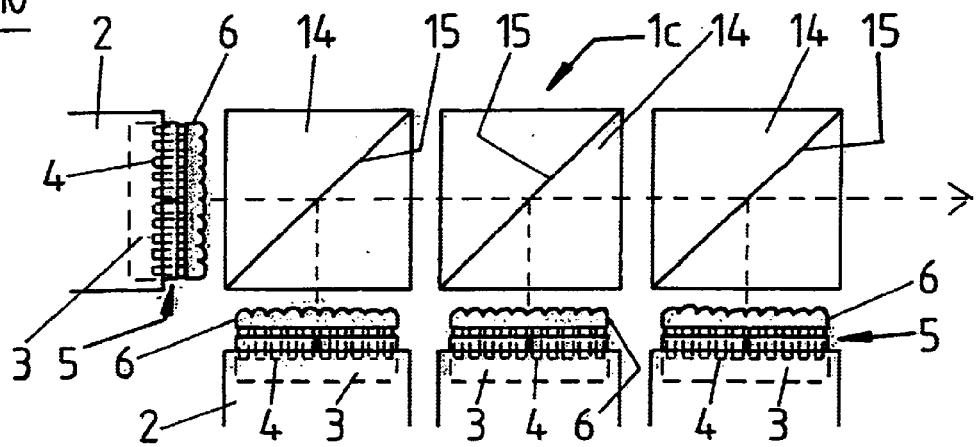
Figure 11:
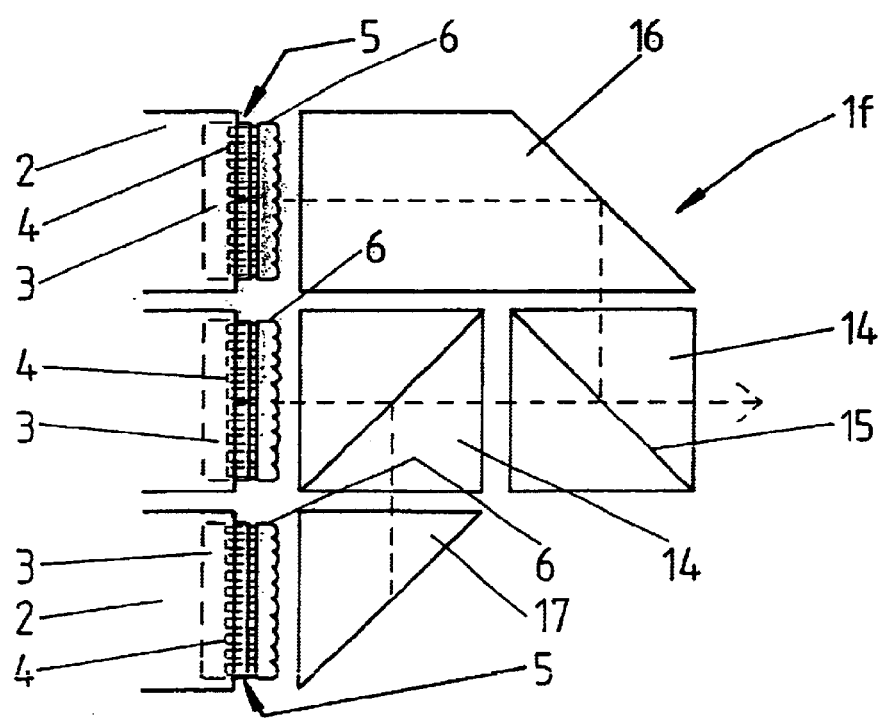

FIGS. 9–11 show as other alternate embodiments of laser diode arrangements 1d, 1e and 1f. In the laser diode arrangement 1d, there are two diode laser bars 3 with one segmented fast axis collimator 5 each, and one pertinent slow axis collimator 6 each offset by 90° on a coupling element 14 which is formed by a prism cube. Suitable dielectric filter coatings on the connecting surface 15 which is located at 45° enables combination or coupling of diode laser bars of different wavelength, by means of edge filters, or by means of different polarization means, with polarization filters.

In the laser diode arrangement 1e of FIG. 10, three coupling elements 14 are shown for coupling or combination of four diode laser bars 3, each with its own segmented fast axis collimator 5 and its own slow axis collimator 6. In this embodiment having more than two diode laser bars 3, modifications are conceivable in which not only wavelength coupling or polarization coupling, but also combinations thereof, are used.

FIG. 11 shows another alternate embodiment of a laser diode arrangement 1f in which, in addition to the coupling element 14, deflection elements 16 and 17 are used, which, for example, are deflection prisms, or deflection mirrors and which then allow parallel arrangement of the laser diode bars 3, the pertinent fast axis collimators 5 and the slow axis collimators 6.

The laser diode arrangements disclosed, 1d–1f stacks, with stack layers 9' and 10' which correspond to the stacks 9 and 10 can be used, each stack layer having at least one diode laser bar 3, a pertinent segmented fast axis collimator 5 and a slow axis collimator 6. With the corresponding formation of the coupling elements 14, and/or the deflection elements, 16 and 17, and with the correspondingly offset arrangement of the stack layers from stack to stack, it is then possible to push the beams of at least individual diode laser bars 3 of different stacks on top of one another interdigitally to increase the filling factor in the fast axis, as was described above for the laser diode arrangement 1c of FIGS. 7 and 8, and optionally in addition to wavelength coupling and/or polarization coupling.

Figure 12:
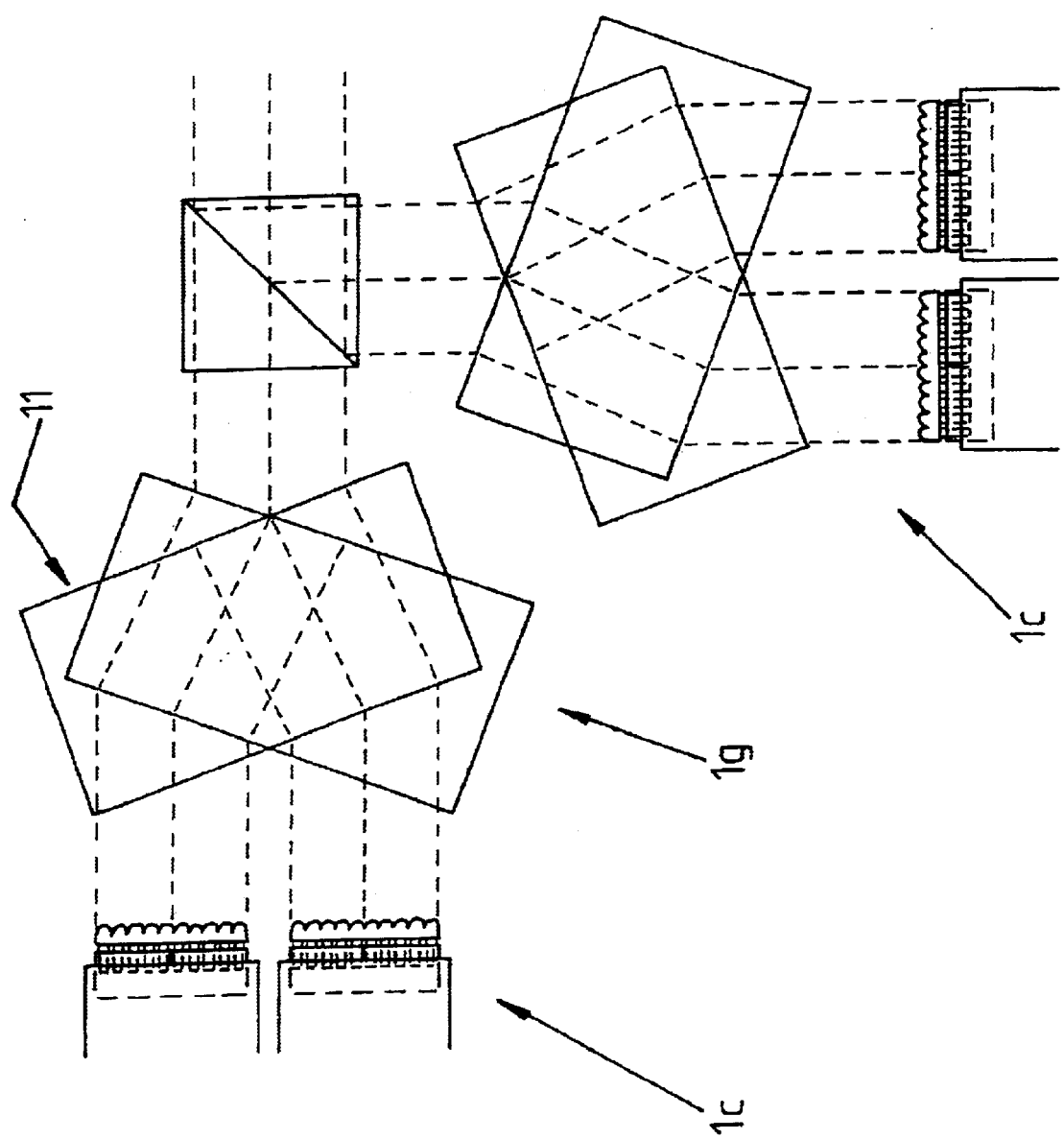

FIG. 12 shows in one representation similar to FIGS. 9–11, as another alternate embodiment, a laser diode arrangement 1d in which the laser diode arrangement 1c of FIGS. 7 and 8 is provide twice and the beam clusters of the two optical arrangements 11 are combined via an optical coupling element 14 by means of wavelength multiplexing and/or polarization multiplexing into a common beam cluster with an especially high filling factor. The optical coupling element 14 is then, for example, in turn one as was described above in conjunction with FIGS. 9–11.

Figure 13:
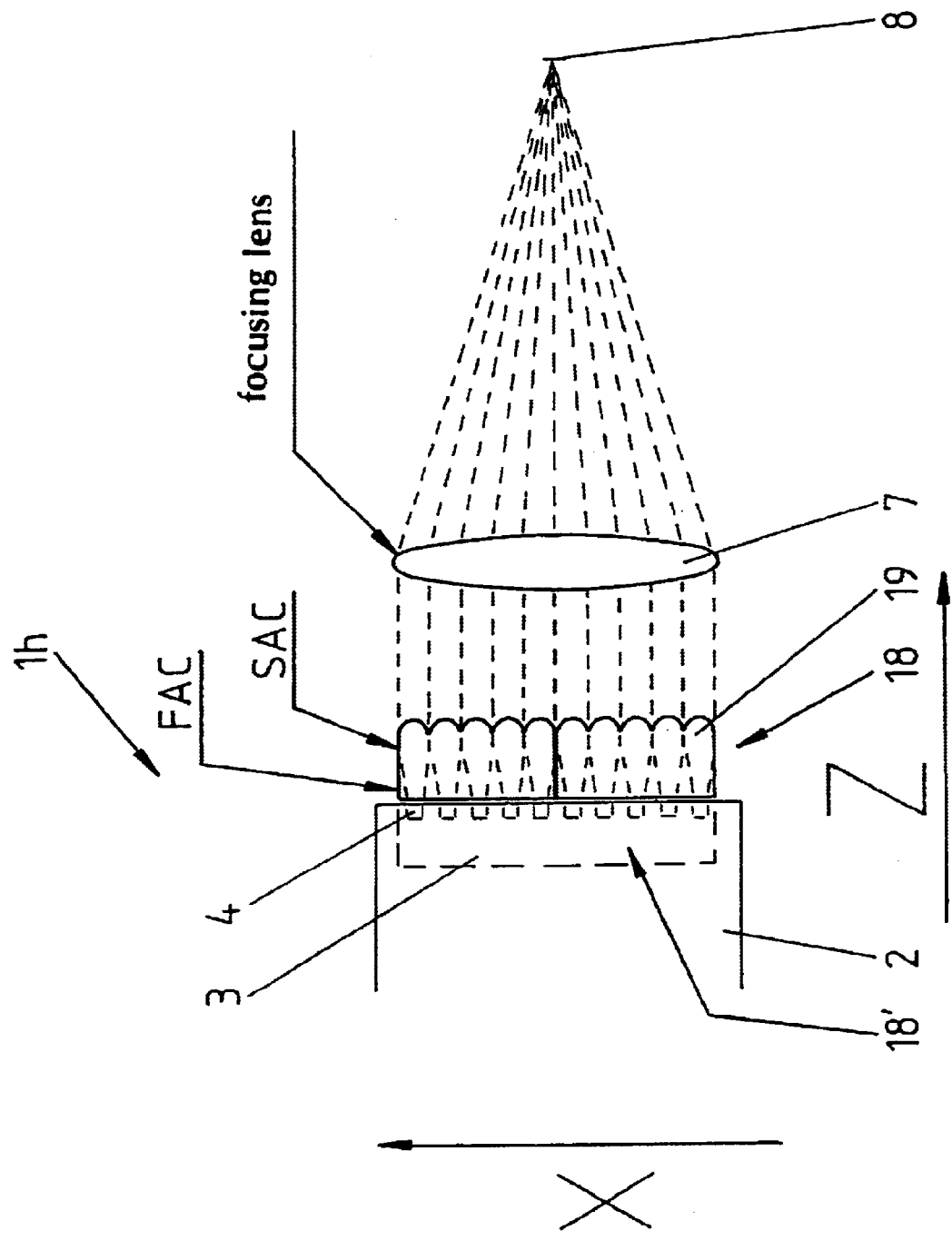
FIGS. 13 and 14 show an alternate embodiment of the laser diode arrangement as claimed in the invention in representations according to FIGS. 1 and 2.
Figure 14:
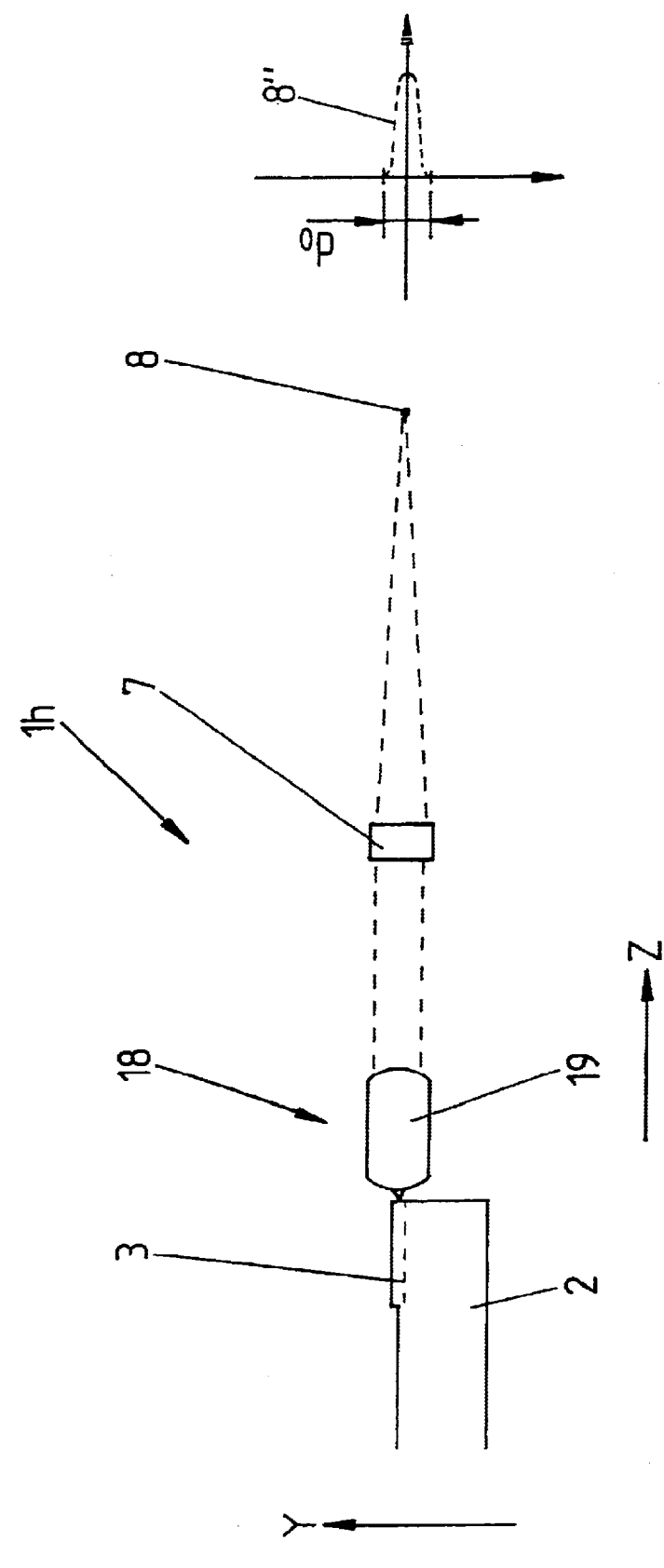

While in the embodiments of FIGS. 1–12 it was assumed that the fast axis collimator 5 and the slow axis collimator 6 of the respective correction optics are discrete optical components, FIGS. 13 and 14, as an alternate embodiment, show a laser diode arrangement 1h which in turn has at least one diode laser bar 3 with emitters 4 on at least one cooler 2 and in which in the beam path (Z axis) there is correction optics 18 following the diode laser bars. The correction optics 18 are in turn segmented in two in the directions of the slow axis (X axis), i.e. it has in this axial direction two adjoining segments 18', of which at least one can be adjusted individually with reference to the diode laser bars 3, or the emitters there.

Each segment 18' includes several individual lenses or lens elements 19 which are combined monolithically into the pertinent segment 18' or are connected to the pertinent segment 18' as actual individual lenses. Each individual lens 19 has the function of a fast axis collimator and a slow axis collimator, in the embodiment shown, such that the beams of the individual emitters 14 in the beam path following the correction optics 18 in the plane of the slow axis are parallel, or roughly parallel beams, and furthermore, the beams of adjacent emitters 4 adjoin one another as tightly as possible, without beam overlapping in the direction of the slow axis (X axis). Each lens element 19 is assigned to one emitter 4 and is made, for example, such that it forms on its entry surface one cylinder lens surface which is active in the fast axis and on the exit surface, one cylinder lens surface which is active in the slow axis.

Correction of nonconformities between the diode laser bars 3 and the correction optics 18 takes place in the laser diode arrangement 1h by the corresponding adjustment of the segments 18'.

The correction optics 18 can be made in one piece, i.e. not segmented, when compensation of nonconformities between these correction optics and the respective diode laser bars 3 is not necessary. Furthermore the correction optics 18 can be used in laser diode arrangements in which there are two or more as two diode laser bars 3, for example, also in one or more stacks, then preferably for each diode laser bar there being its own correction optics 18.

The invention was described above in varying related embodiments. Numerous modifications and versions are possible without departing from the inventive idea underlying the invention. Thus, for example, it is also possible, instead of emitters 4 formed on laser bars 3, to have individual laser diodes with only one emitter each, and which then according to the emitters 4 are provided on a suitable carrier, especially a cooler 2, following one another or spaced apart in the direction of the slow axis (X axis).

Reference Number List 1, 1a, 1b, 1c, 1d, 1e, 1f, 1g, 1h laser diode arrangement
2 cooler
3 diode laser bar
4 emitter
5 fast axis collimator
5' optical element
6 slow axis collimator
6' optical element
7, 7b focusing optics
8, 8b focus
9, 10 stack
9', 10' stack layer
11 optical arrangement
12, 13 plate prism
14 optical coupling element, for example prism cube
15 dielectric filter coating
16, 17 deflection element, for example deflection prism or deflection mirror
18 correction optics
18' segment of correction optics
19 lens element
X axis
Y axis
Z axis
Y—Y plane
X-Z plane
y=distance
M center plane a, b angle

What is claimed is:

1. A laser diode arrangement, comprising:
   at least one row of emitter elements which emit laser light and which are arranged in a direction of a slow axis (X-axis) following one another and spaced apart from another,
   at least one correction optics which extends in the slow axis (X-axis) and spaced from said at least one row of emitter elements in a beam direction and which acts as a fast axis collimator and a slow axis collimator,
   wherein the at least one correction optics are segmented at least in a part acting as the fast axis collimator such that its comprises a plurality of correction optic segments which follow one another in the slow axis (X-axis),
   said correction optic segments of the fast axis being individually adjusted and fixed independently of one another in relation to the at least one row of emitter elements.

2. The laser diode arrangement as claimed in claim 1, wherein the at least one correction optics are formed by at least one lens element which is made as the fast axis collimator and the slow axis collimator.

3. The laser diode arrangement as claimed in claim 2, wherein the at least one lens element comprises an entry side with a lens surface which acts as the fast axis collimator, with a cylinder lens surface with the axis lying in a direction of the slow axis (X axis) and an exit side with at least one lens surface which acts as the slow axis collimator, with at least one cylinder lens surface with an axis lying in the fast axis (Y axis).

4. The laser diode arrangement as claimed in claim 1, wherein the at least one correction optics has a plurality of Lens elements which adjoin one another in the direction of the slow axis (X axis).

5. The laser diode arrangement as claimed in claim 1, wherein the at least one correction optics is produced in one piece or monolithically with a plurality of lens elements.

6. The laser diode arrangement as claimed in claim 1, wherein each lens element of the correction optics is assigned to an emitter element.

7. The laser diode arrangement as claimed in claim 1, wherein the at least one correction optics is segmented and comprises at least two correction optics segments which follow one another in a direction of the slow axis (X axis).

8. The laser diode arrangement as claimed in claim 7, wherein the at least one correction optics segment has at least two lens element.

9. The laser diode arrangement as claimed in claim 1, wherein the at least one correction optics collimates or shapes beams of the at least one row of emitter elements into beams which are parallel or roughly parallel to one another in the plane of the slow axis (X axis).

10. The laser diode arrangement as claimed in claim 1, wherein the at least one correction optics collimates or shapes the beams of the at least one row of emitter elements into beams which are parallel or roughly parallel to one another in the plane of the slow axis (X axis) and adjoin one another in the direction of the slow axis (X axis) without overlapping one another.

11. The laser diode arrangement as claimed in claim 1, wherein a part of the at least one correction optics which acts as the slow axis collimator has a plurality of lens elements which in their optical action correspond to cylinder lenses which are oriented with their axis in the fast axis (Y axis), and which adjoin one another in the direction of the slow axis and of which one is assigned to one emitter element at a time.

12. The laser diode arrangement as claimed in claim 1, wherein the at least one correction optics has at least one fast axis collimator for at least one row of emitter elements which forms a segmented part of the at least one correction optics and which comprises a plurality of collimator segments which follow one another in the slow axis (X axis).

13. The laser diode arrangement as claimed in claim 12, wherein the plurality of collimator segments of the fast axis collimator of the at least one row of emitter elements are adjusted and fixed independently of one another.

14. The laser diode arrangement as claimed in claim 1, wherein the at least one correction optics has at least one slow axis collimator located in a beam path (Z axis) following the fast axis collimator.

15. The laser diode arrangement as claimed in claim 14, wherein the slow axis collimator is formed by a host of cylinder lens elements which in their optical action correspond to cylinder lenses and which are oriented with their axis in the fast axis (Y axis), which adjoin one another in a direction of the slow axis and of which one is assigned to one emitter element at a tire.

16. The laser diode arrangement as claimed in claim 4, wherein in the beam path following the at least one correction optics there is focusing optics for focusing beams of the emitter elements at a common focus.

17. The laser diode arrangement as claimed in claim 1, wherein the segmented part of the at least one correction optics has from two to five segments.

18. The laser diode arrangement as claimed in claim 1, wherein there is a connection area or gap between two segments which follow one another between two emitter elements, the connection area being in a middle between the two emitter elements.

19. The laser diode arrangement as claimed in claim 1, wherein a part of the at least one correction optics which acts as the slow axis collimator is located in a plane (E) which is defined by the fast axis (Y axis) and the slow axis (X axis) and is located in a beam path where edge beams of the beams diverging in the slow axis (X axis) intersect with their edge beams.

20. The laser diode arrangement as claimed in claim 19, wherein the part of the at least one correction optics acting as the slow axis collimator is formed by several cylinder lenses combined into a monolithic slow axis collimator.

21. The laser diode arrangement as claimed in claim 12, wherein the plurality of collimator segments of the fast axis collimator are cylinder lenses or act as cylinder lenses.

22. The laser diode arrangement as claimed in claim 1, wherein there are at least two rows of emitter elements and wherein the rows with the slow axis (X axis) of the emitter elements are parallel to one another.

23. The laser diode arrangement as claimed in claim 1, wherein there are at Least two rows of emitter elements and wherein the emitter elements of the rows have active layers located in parallel planes.

24. The laser diode arrangement as claimed in claim 1, wherein there are at least two rows of emitter elements and wherein the at least two rows are offset against one another at least in the slow axis (x axis).

25. The laser diode arrangement as claimed in claim 1, wherein there are at least two rows of emitter elements and wherein in a beam path following the fast axis collimator there is at least one optical coupling element or deflection element to combine beams of the at least two rows into a common beam cluster.

26. The laser diode arrangement as claimed in claim 1, wherein there are at least two rows of emitter elements in at least one stack, wherein the at least two rows of emitter elements in the stack are offset against one another in a direction of the fast axis (Y axis) and wherein for each raw of emitter elements there is one separate, segmented part or the correction optics or segmented fast axis collimator with at least two segments.

27. The laser diode arrangement as claimed in claim 1, wherein the at least one row of emitter elements, has at least one row of emitter elements with a segmented part of the at least one correction optics or a segmented fast axis collimator.

28. The laser diode arrangement as claimed in claim 1, wherein for each row of emitter elements there are separate correction optics.

29. The laser diode arrangement as claimed in claim 1, wherein for each row of emitter elements (4) there is a separate slow axis collimator (6).

30. The laser diode arrangement as claimed in claim 1, wherein there are rows of emitter elements in at least two stacks, the rows in each stack being offset against one another in a direction of the fast axis (Y axis).

31. The laser diode arrangement as claimed in claim 30, wherein the at least two stacks are offset against one another in a direction of the slow axis (X axis).

32. The laser diode arrangement as claimed in claim 2, wherein planes of the rows of emitter elements of at least two stacks are offset in a direction of the fast axis (Y axis) such that the planet of the rows of one stack lie between the planes of the rows of another stack.

33. The laser diode arrangement as claimed in claim 32, wherein an optical means with which the beams of the emitter elements in the slow axis (X axis) are shifted such that the beams of the emitter elements of all stacks form a common beam cluster.

34. The laser diode arrangement as claimed in claim 1, further comprising focusing optics which are common to the beams of all emitter elements.

35. The laser diode arrangement as claimed in claim 1, wherein at least one row of emitter elements is formed by a diode laser bar.

36. The laser diode arrangement as claimed in claim 35, wherein the diode laser bar is a semiconductor laser chip with several emitters.

37. The laser diode arrangement as claimed in claim 1, wherein the emitter elements each comprise at least one emitter which radiates laser light.

38. The laser diode arrangement as claimed in claim 1, wherein the emitter elements each comprise at least two emitters which are located at a distance from one another which is smaller than the mutual distance of the emitter elements in each row.

39. The laser diode arrangement as claimed in claim 1, wherein a distance between the emitter elements and a width of the emitter elements in the direction of the slow axis (X axis) is chosen such that an occupation density or a quotient of a total length of radiating areas of one row of emitter elements and the total length is less than 10%.

40. The laser diode arrangement as claimed in claim 1, with at least one row of emitter elements which radiate laser light and which are located in a row with the active layer in a common plane (X-Z plane) perpendicular to the fast axis (Y axis).

41. A laser diode arrangement, comprising:
at least one row of emitter elements which emit laser light and which are arranged in a direction of a slow axis (X-axis) and spaced apart from another,
at least one correction optics which extends in the slow axis (X-axis) and spaced from said at least one row of emitter elements in a beam direction and which acts as a fast axis collimator and a slow axis collimator,
wherein the at least one correction optics are segmented at least in a part acting as the fast axis collimator such that its comprises a plurality of correction optic segments which follow one another in the slow axis (X-axis),
wherein a part of the at least correction optics which act as a slow axis collimator comprises a plurality of lens elements which in their optical action correspond to cylinder lenses which are orientated with their axis in the fast axis (Y-axis) and which adjoin one another in the direction of the slow axis and of which each one is assigned to one emitter element.

42. The laser diode arrangement as claimed in claim 41, wherein the at least one correction optics have segments that are adjusted and fixed independently of one another.

43. A laser diode arrangement, comprising:
at least one row of emitter elements which emit laser light and which are arranged in a direction of a slow axis (X-axis) following one another and spaced apart from another,
at least one correction optics which extends in the slow axis (X-axis) spaced from said at least one row of in a beam direction and which acts a fast axis collimator as well as a slow axis collimator, wherein the at least one correction optics are formed by a plurality or lens element which adjoin one another in the direction of the slow axis (X-axis),
each lens element being made as the fast axis collimator and the slow axis collimator and comprises an entry side with a lens surface which acts as a fast axis collimator with a cylinder lens surface with the axis laying in a direction of the slow axis (X-axis) and an axis side with at least one lens surface which acts as the slow axis collimator with at least one cylinder lens surface with an axis laying in the fast axis (Y-axis).

44. A laser diode arrangement, comprising:
at least two rows of emitter elements which emit laser light and which are arranged in a direction of the slow axis (x-axis) following one another in each row and spaced apart from another,
at least one correction optics for each row of emitter elements, which extends in the slow axis (X-axis) and spaced from said at least two rows of emitter elements in a beam direction and which acts as a fast axis collimator as well as a slow axis collimator,
the at least two rows of emitters being offset by 90° on a coupling element to combine beams of the at least two rows in a common beam plaster.

* * * * *